United States Patent
Liaw et al.

(10) Patent No.: US 6,249,018 B1
(45) Date of Patent: Jun. 19, 2001

(54) FABRICATION METHOD TO APPROACH THE CONDUCTING STRUCTURE OF A DRAM CELL WITH STRAIGHTFORWARD BIT LINE

(75) Inventors: Ing-Ruey Liaw, Hisnchu; Wen-Jya Liang, Hsinchu, both of (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/292,128

(22) Filed: Apr. 14, 1999

Related U.S. Application Data

(63) Continuation-in-part of application No. 09/031,260, filed on Feb. 26, 1998, now abandoned.

(51) Int. Cl.⁷ .................................................. H01L 29/94
(52) U.S. Cl. ........................... 257/303; 257/734; 257/908
(58) Field of Search ................................ 257/734, 303, 257/306, 905, 296, 908; 438/253

(56) References Cited

U.S. PATENT DOCUMENTS

| | | |
|---|---|---|
| 5,654,567 | 8/1997 | Numata et al. . |
| 5,671,175 | 9/1997 | Liu et al. . |
| 5,753,949 | 5/1998 | Honma et al. . |

*Primary Examiner*—Sara Crane
(74) *Attorney, Agent, or Firm*—Christensen O'Connor Johnson Kindness PLLC

(57) ABSTRACT

A conducting structure of a COB cell of DRAM includes an piecewise straight active area and substantially straight bitline formed over a semiconductor substrate upon which a first dielectric layer existed. Contact holes are formed over the piecewise straight active area for electrically exposing both nodes (source and drain), of the active area of the access device. An offset landing plug pattern is defined by a photoresist-clear pattern beside, say, the source node of the primary contact pattern and recess-etched into the first dielectric layer and electrically connected to the source node of the primary contact structure finally. The contact structure is then formed by a deposition-etched process, which performs as a landing plug for contact of the upper contact structures. The top area of the landing plug is defined through the additive pattern of the primary contact as well as the offset landing plug pattern. Thereafter, a second dielectric layer is deposited on the first dielectric layer and the contact structure. A bit line contact is then formed in the second dielectric layer and defined at the offset position of the source node of the landing plug contact structure and electrically connected with it, so as to provide a capability of forming a substantially straight bit line lies on an off-axis site to the piecewise straight active area and the primary substrate contact plug.

5 Claims, 5 Drawing Sheets

FABRICATION METHOD TO APPROACH THE CONDUCTING STRUCTURE OF A DRAM CELL WITH STRAIGHTFORWARD BIT LINE

CROSS-REFERENCE TO RELATED APPLICATIONS

This application is a continuation-in-part of prior Application No. 09/031,260, filed Feb. 26, 1998, now abandoned.

FIELD OF THE INVENTION

The present invention relates to a method for achieving a multilevel contact structure, which is used in the manufacture of integrated circuits, and more specifically, to a conducting structure applied in a DRAM cell.

BACKGROUND OF THE INVENTION

The provision of interconnections in the design of a COB (capacitor over bit line) cell of DRAM is particularly important. In the conventional design, a bit line is twisted to allow the capacitor to contact the substrate. FIG. 1 illustrates such a conventional design. An active area 100 is formed over a substrate. A contact hole 110 is subsequently formed over portions of the active area 100. Then, a bit line contact 120 is aligned with and formed over the contact hole 110. Finally, a bit line 130 is formed on the bit line contact 120. Portions of the bit line 130 overlap with the bit line contact 120 to form electrical interconnections and than turn back to an off-axis position of active area as bypassing the node contact plug to leave a enough isolation spacing from the node contact. The path of the bit line 130 is thus twisted as a consequence.

The provision of bit lines that are twisted, rather than substantially straight, results in many disadvantages. Series resistance and parasitic capacitance degrade the bit signal as well as raise the resolution and overlay difficulties in wafer processing steps. One possible solution to this limitation could be to twist the orientation of the active area instead of the bit line. However, such a design induces other processing or material issues that still more involving in device manufacturing.

As the urge for higher packing density of DRAM, the planner dimension (or area) of the unit cell keeps going to smaller and smaller via the advances in the lithographic system and the self aligned contact (SAC) technology. However, because of the tolerance of isolation thickness in SAC etching as well as the polishing level variation in CMP planarization, a definite height in vertical is still in need. The aspect ratio of the cell node contact ( or bit line contact in CUB cell) goes still worse and worse. This makes the reliability of the contact resistance and/or the substrate damage become uncontrollable. A two-step contact structure, which uses projected landing pads or recessed landing plugs raised from substrate as step buffering for the second contact forming steps, has been undertaken commonly by most of the DRAM chip supplier.

SUMMARY OF THE INVENTION

In this disclosure, substrate contact landing plugs with off-axis landing sites is achieved by using a novel integrated process. So the aspect ratio of the node contact can be substantially reduced. By introducing one more lithographic layer of isolated hole, we can use the simplest and most reliable patterns of piecewise straight active area, unit sized plug contact and substantially straight bit line layouts, with the least cost in processing steps and slightest resultant surface fluctuation.

For approaching the conducting structure, a conventional COB cell with piecewise straight active areas is used as an illustration. After the accomplishment of the processing steps of the access device, a first dielectric layer is deposited. A contact pattern is then formed on the first dielectric layer for exposing the surface of substrate both at the node contact and bit line contact area, by using a first photoresist layer as a mask to etch the first dielectric layer. This is usually a SAC process that the contacts are self aligned to the substrate as etched. An offset landing plug pattern is then defined by a photoresist-clear pattern only beside the contact pattern at the bit line contact area and recess-etched to an extent into the first dielectric layer, so as to electrically connect with the primary contact structure at the bit line contact site finally. The contact structure is then formed by a deposition-etched process, which performs as a landing plug for the upper contact structures. The top area of the landing plug is thus defined via the additive pattern of the primary contact as well as the offset landing plug pattern. A second dielectric layer is then deposited on the first dielectric layer and the contact structure. Thereafter, a bit line contact pattern is defined by a third photoresist layer. The bit line contact is just located at the position of the offset landing plug and etched to its top, thereby, providing a capability of forming a substantially straight bit line passing over the bit line contact, which is electrically connected with the active area through the bit line contact and the landing plug contact structure.

DETAILED DESCRIPTION OF THE PREFERRED EMBODIMENTS

For overcoming the disadvantages mentioned above, the present invention discloses a fabrication method to approach a conducting structure with a substantially straight bit line. By broadening a top portion of traditional contact structure, an offset landing plug would be formed in the broadened region and serve as a part of the contact structure. The offset landing plug has an extensive area, which provides the semiconductor a capability of forming a substantially straight bit line. For illustrating clearly, an embodiment is used to describe the invention in the following paragraphs.

Figure 1:
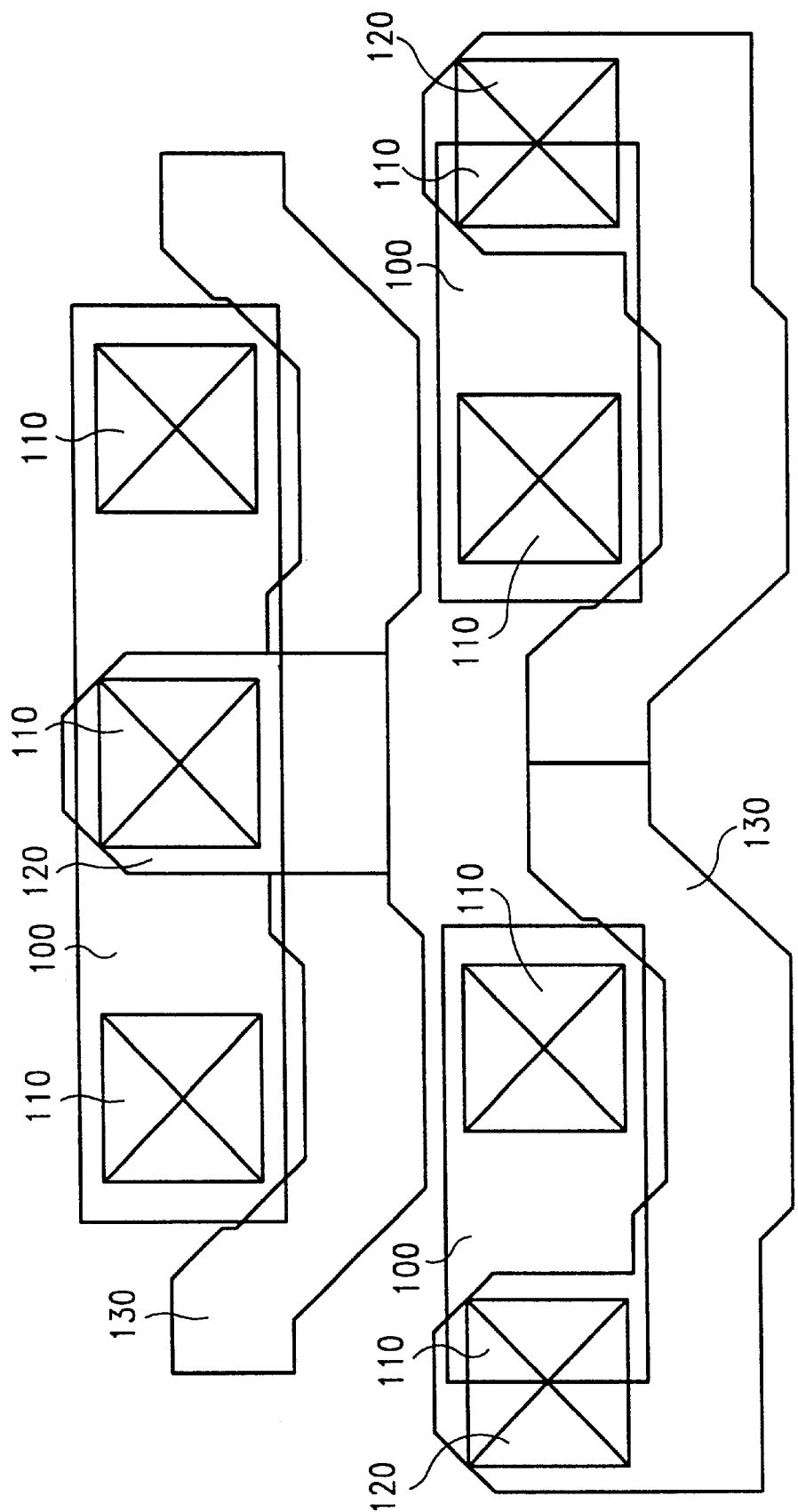
FIG. 1 is a conducting structure in accordance with prior art.
Figure 2:
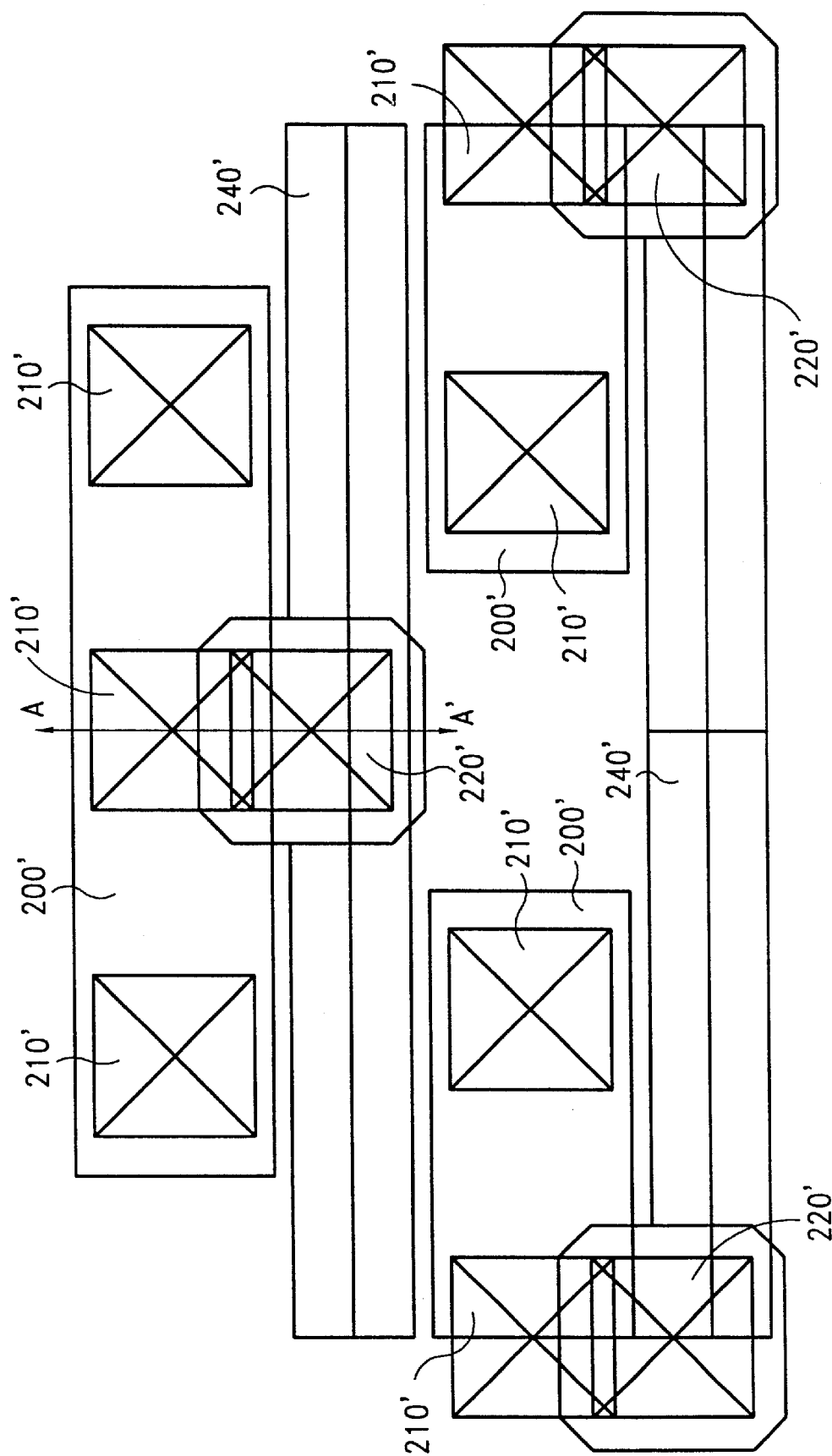
FIG. 2 is a layout pattern in accordance with the present invention.

FIG. 2 shows a layout pattern for fabricating a semiconductor structure with substantially straight bit lines in the invention. Patterns 200' are used to map active areas on a surface of semiconductor substrate. A photoresist layer, which is utilized to define the active areas, is formed over the semiconductor substrate by transferring patterns 200' onto the photoresist layer in a photolithography process. Thereafter, the active areas are formed in the region defined by patterns 200'. The contact structures are made of conductive materials for electrically connecting devices and circuits in the semiconductor structure. At the first, patterns 210 are used to define a plurality of contact structures, which are formed on portions of the active areas. Then, patterns 220' are selectively applied to define offset landing plug above some of contact structures. After then, patterns 220' could be used again to define bit line contacts on the surfaces of offset landing plugs for further providing bit lines, which are defined by patterns 240', without twist.

As discussed above, the locations of conducting structures are defined by several layout patterns. Therefore, the alignment of patterns would be a crucial issue of achieving the desired structure. Typically, the more complicated layout patterns would induce more inaccurate conducting structures. For fabricating accurate conducting structures, the present invention allows the patterns 220' merely aligning with some desired contact structures instead of every contact structure, thereby simplifying the layout patterns 220' as well as increasing the accuracy of mapped conducting structures.

Figure 3:
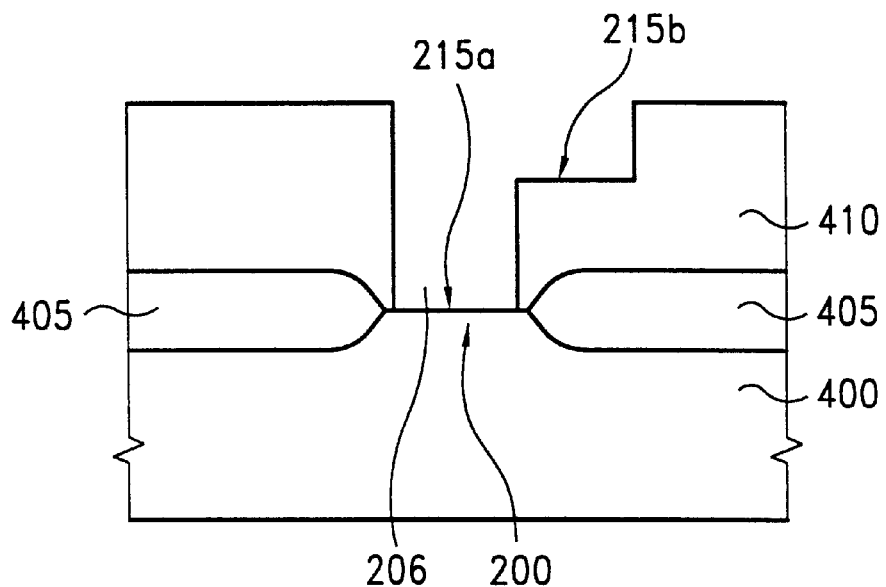
FIG. 3 is a cross-sectional view of the present semiconductor structure with a contact hole and offset landing region.

FIG. 3 displays a cross-sectional view of a semiconductor structure along axis A–A' (see FIG. 2) for describing an embodiment of forming a desired conducting structure according to the present invention. Active area 200 is defined on substrate 400 and isolated from other semiconductor devices by isolation regions 405, such as Field Oxide or Trench. A first 25 dielectric layer 410 is deposited on the surfaces of active area 200 and isolation region 405. Typically, the first dielectric layer 410 could be selected from the dielectric materials, such as $SiO_2$, $Si_3N_4$, PSG, and BPSG.

For electrically connecting devices or circuits inside active area 200, a first photoresist layer (not shown in figure) is placed on the surface of the first dielectric layer 410 to define vertical portion of contact hole 206. Applying the first photoresist layer as an etching mask, the first dielectric layer 410 would be etched downwardly until surface 215a of active area 200 exposed. Then, first photoresist layer is removed from the surface of first dielectric layer 410. When the first photoresist layer has been stripped, a second photoresist layer (not shown in figure) is disposed on the surface of first dielectric layer 410 in order to define offset landing portion 215b of contact hole 206. Thereafter, etching first dielectric layer 410 by means of serving the second photoresist layer as a mask, portion 215b would be formed in the top region of contact hole 206. In the process of forming horizontally extensive portion 215b, first dielectric layer 410 would be merely etched a shallow depth instead of reaching active area 200. When contact hole 206, which has both vertical portion 215a and horizontal portion 215b, is achieved, the second photoresist layer would be stripped so as to proceed following processes.

Figure 4:
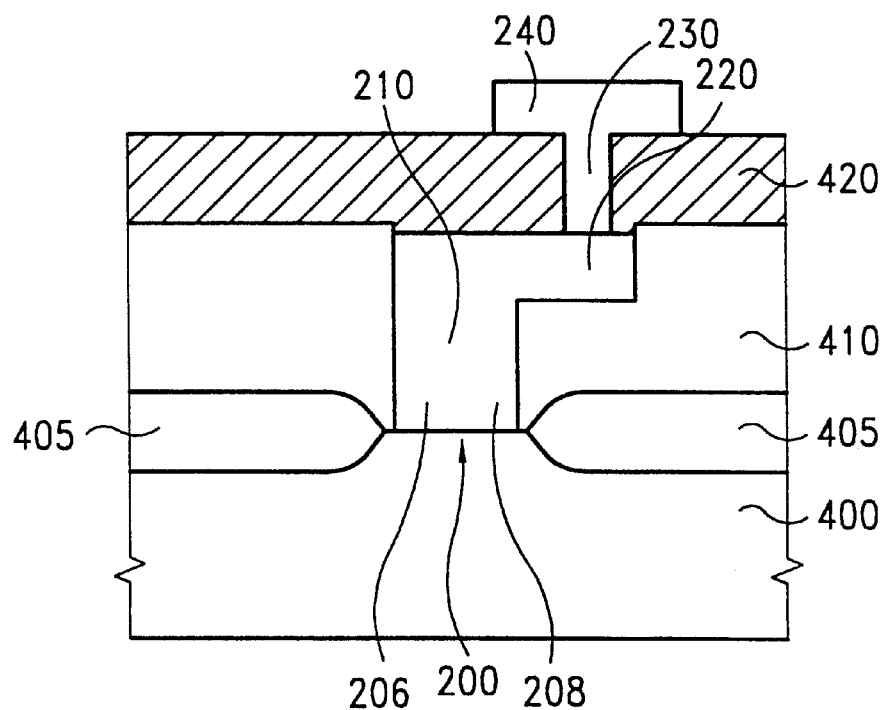
FIG. 4 is a cross-sectional view of the present semiconductor structure with a contact structure having an offset landing plug.

Referring to FIG. 4, a conductive layer is formed inside the contact hole 206 as well as on the surface of first dielectric layer 410. Since the top region of contact hole 206 has been broadened as extensive portion 215b, the performance of step coverage of contact hole 206 would be better than without extensive portion 206. Then, planarizing the surface of the conductive layer, contact structure 210 is formed in the contact hole 206 as two parts, the vertical portion 208 and the offset landing plug 220. Typically, the planarization process is alternative between a method of etching back and CMP. As for the conductive layer, it could be usually selected from Tungsten, Aluminum, and Ploysilicon.

After then, second dielectric layer 420 is deposited on the surface of first dielectric layer 410 and contact structure 210. A third photoresist layer (not shown in figure) is disposed on the surface of second dielectric layer 420, so as to define the area of bit line contact 230. As mentioned above, the masks of defining the area of offset landing plug 220 and bit line contact 230 could be the same one. Nevertheless, by applying the third photoresist layer as an etching mask, bit line contact hole (the same position with bit line contact 230) is formed in second dielectric layer 420 as well as exposed the surface of offset landing plug form it. After the third photoresist layer stripped, a second conductive layer is deposited in the bit line contact hole and surface of second dielectric layer 420. Patterning and etching the second conductive layer, a desired conducting structure with a substantially straight bit line is achieved and shown as the figure. Through contact structure 210 and bit line contact 230, bit line 240 is able to connect with active area 200 electrically. Furthermore, offset landing plug 220 provides the capability of shaping bit line 240 without twisting.

Figure 5:
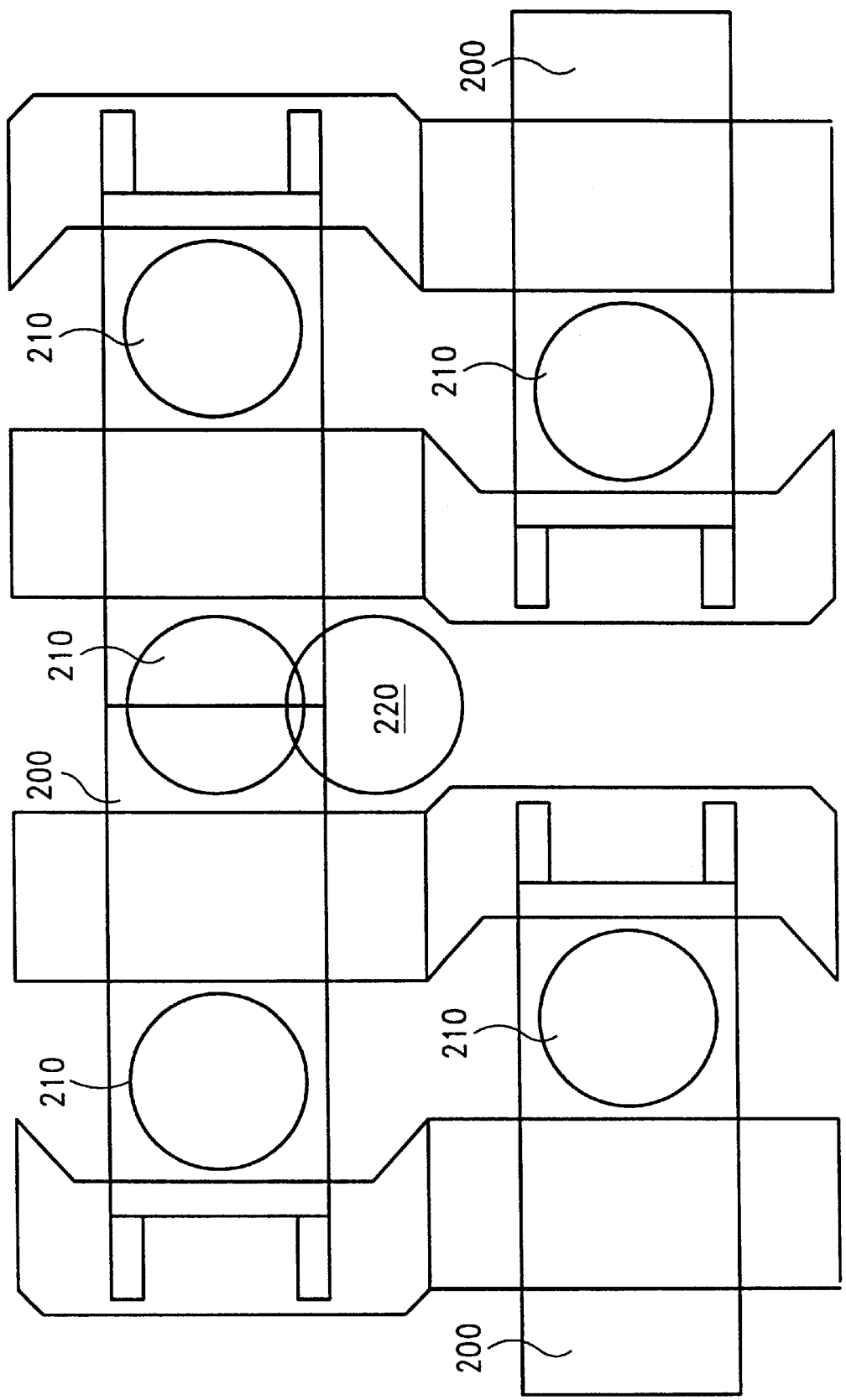
FIG. 5 is a top view of a contact structure in accordance with the present invention.
Figure 6:
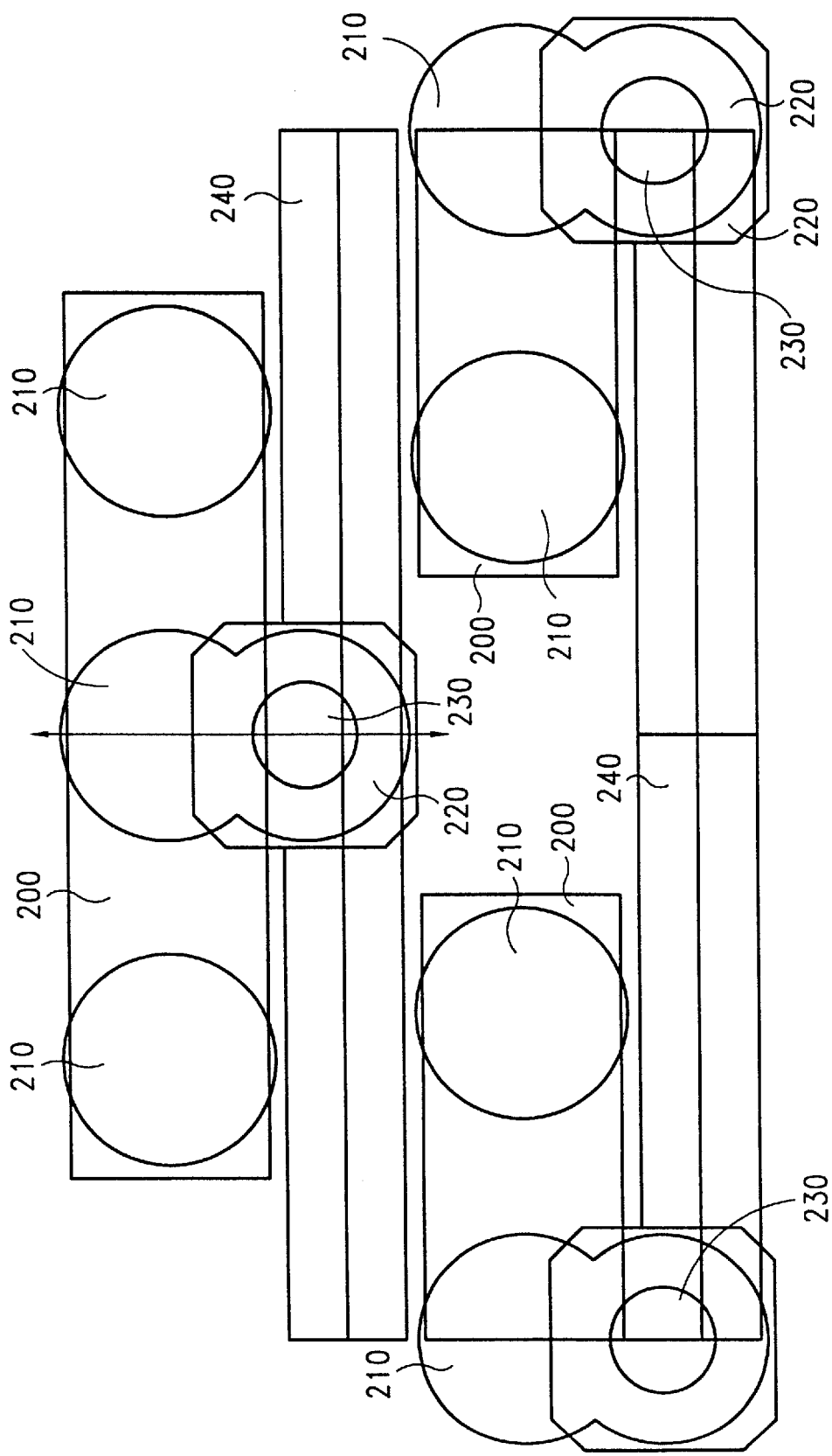
FIG. 6 is a top view of the present semiconductor structure having a straight bit line connected with the contact structure.

FIG. 5 and FIG. 6 illustrate a top view of conducting structure according to the present embodiment. Referring to FIG. 5, active areas 200 are formed over a semiconductor substrate. The contact structures 210 are formed over a portion of the active areas 200. The offset landing plug 220 is selectively formed on one of the contact structures 210. For a good electrical connection, a wet etch process may be used to enlarge the top dimensions of the primary contact hole 210 and the offset shallow hole 220 as just etched.

FIG. 6 is an illustration of the top view of the final result from the above embodiment. It also shows the result of pattern rounding and the enlargement of contact size after DHF clean usually performed before the deposition of plug material, which provide the sufficient overlap and reliable connection of the whole contact structure. Bit line contacts 230 are formed on the surface of offset landing plugs 220 within the contact structures 210. Then, bit lines 240 are formed parallel with active areas 200, thereby straightening the bit lines 240 from twisting in accordance with prior art.

As illustrated above, the present invention discloses a contact structure, with an offset landing plug, within a single dielectric layer. The present method of approaching the specific conducting structure, is not only providing a COB DRAM cell the simplest piecewise straight active areas and substantially straight bit line, but also allowing a layout in the cost of merely an extra conventional contact hole mask layer. Therefore, the depth of the contact structure would not be heightened by means of performing the present fabrication process. In addition, since the offset landing plug is selectively imposed on the desired contact structure instead of all contact structures in a way without creating any step difference. Therefore, the mask of offset landing plug would be designed as simple as possible, so as to reduce the risk of miss-patterning caused by a complicated mask, probably. Furthermore, before the second dielectric layer deposited, the present conducting structure provides a rather smooth top surface compared to the conventional projected-type landing pad structure. Thus, it doesn't need an extra planarization step for the second dielectric layer often used in those structures. All the above advantages of the invention will significantly reduce the complexity of manufacture process as well as the cost of the device production. Finally, it should be noticed that an alternative to approach the Conducting Structure with non-additional mask layer is practically possible, by applying a multi-sized plug contact pattern layout. In other words, using contact mask with a broadened size pattern at the bit line node in company with the normal size pattern at the storage node, the off-axis landing plug contact structure is thereby achieved within one photoresist mask pattern layer. Therefore, in such a design, the cost of the extra lithograph etch process of the offset landing plug could be saved. However, in such an approach, a novel broadened contact etching technology with precisely etching end point control, which is supposed to be stop at the boundary of active area without damaging the isolation region, is still needed eagerly. Since otherwise the override and undercut of the isolation region boundary may cause serious isolation and/or junction leakage issues in many cases.

As is understood by a person skilled in the art, the forgoing description of the preferred embodiment of the present invention is illustrative of the present invention rather than a limitation thereon. It is intended to cover various modifications and similar arrangements included within the spirit and scope of the appended claims. The scope of the claims should be accorded with the broadest interpretation so as to encompass all such modifications on the similar structure. While the preferred embodiment of the invention has been illustrated and described, it will be appreciated that various changes can be made therein without departing from the spirit and scope of the invention.

What is claimed is:

1. A conducting structure for a semiconductor device, said structure comprising:

a substrate;

a first dielectric layer on the substrate;

a contact structure having an offset landing plug located in the first dielectric layer, wherein a bottom end of the contact structure is connected with the substrate and a top end of the contact structure is exposed from the first dielectric layer;

a second dielectric layer on a surface of the first dielectric layer and the contact structure;

a bit line contact aligned with the offset landing plug disposed in the second dielectric layer;

a bit line electrically connecting with the substrate through the bit line contact and the contact structure formed on the bit line contact.

2. The structure of claim 1, wherein said offset landing plug is selectively broadened at top region of the contact structure.

3. The structure of claim 1, wherein said bit line contact is contacted with either the portion of the broadened landing plug or not broadened landing plug, even both broadened and not broadened contact plugs.

4. The structure of claim 1, wherein said bit line is substantially straight.

5. The structure of claim 1, wherein said substrate, which is itself another conductive layer, further comprises a conductive node, through which the contact structure couples with electrical devices patterned in the substrate.

* * * * *